United States Patent
Wada (10) Patent No.: US 9,312,158 B2
(45) Date of Patent: Apr. 12, 2016

(54) ARTICLE TRANSPORT VEHICLE WITH LINKAGE MECHANISM

(71) Applicant: Daifuku Co., Ltd., Osaka-shi (JP)

(72) Inventor: Yoshinari Wada, Omihachiman (JP)

(73) Assignee: Daifuku Co., Ltd., Osaka-shi (JP)

( * ) Notice: Subject to any disclaimer, the term of this patent is extended or adjusted under 35 U.S.C. 154(b) by 0 days.

(21) Appl. No.: 14/676,123

(22) Filed: Apr. 1, 2015

(65) Prior Publication Data

US 2015/0287623 A1 Oct. 8, 2015

(30) Foreign Application Priority Data

Apr. 7, 2014 (JP) .................................. 2014-078746

(51) Int. Cl.
| | |
|---|---|
| *B66C 13/06* | (2006.01) |
| *H01L 21/673* | (2006.01) |
| *B66C 19/00* | (2006.01) |
| *H01L 21/677* | (2006.01) |
| *H01L 21/687* | (2006.01) |
| *B66C 1/42* | (2006.01) |

(52) U.S. Cl.
CPC .......... *H01L 21/67379* (2013.01); *B66C 1/425* (2013.01); *B66C 13/06* (2013.01); *B66C 19/00* (2013.01); *H01L 21/67733* (2013.01); *H01L 21/68707* (2013.01)

(58) Field of Classification Search
CPC ...................................................... B66C 13/06
See application file for complete search history.

(56) References Cited

U.S. PATENT DOCUMENTS

| | | | | |
|---|---|---|---|---|
| 3,850,306 | A * | 11/1974 | Mundy | B66C 13/06 212/273 |
| 6,099,059 | A * | 8/2000 | Schultz | B65G 47/90 294/119.1 |
| 7,210,589 | B2 * | 5/2007 | Iizuka | B66C 13/06 212/270 |
| 2009/0001040 | A1 * | 1/2009 | Kleiss | B66C 1/104 212/242 |
| 2011/0062103 | A1 * | 3/2011 | Honda | B61B 3/02 212/71 |
| 2012/0118845 | A1 * | 5/2012 | Wada | H01L 21/67733 212/71 |
| 2015/0197412 | A1 * | 7/2015 | Tomida | B66C 13/06 212/273 |
| 2015/0255318 | A1 * | 9/2015 | Wada | B66C 13/18 212/276 |

FOREIGN PATENT DOCUMENTS

| | | | |
|---|---|---|---|
| JP | 2005187175 A | * | 7/2005 |
| JP | 2010126278 A | * | 6/2010 |
| WO | 2009141976 A1 | | 11/2009 |

\* cited by examiner

*Primary Examiner* — Gerald McClain
(74) *Attorney, Agent, or Firm* — The Webb Law Firm (57) ABSTRACT

An article transport vehicle is provided which can prevent a lid from falling from the container gripped by grip portions and which can prevent increase in the size of the device. A lid fall prevention member is provided which can be moved between a near position in which the lid fall prevention member is close to the lid on the side the outer surface of the lid is located, to prevent the lid from falling, and an away position in which the lid fall prevention member is farther away from the lid to allow the lid to be detached and attached. An operatively connecting mechanism is also provided which moves the lid fall prevention member from the near position to the away position as a pair of the grip portions are moved from gripping positions to grip release positions by grip actuator portion, and which moves the lid fall prevention member from the away position to the near position as the pair of the grip portions are moved from the grip release positions to the gripping positions by the grip actuator portion.

12 Claims, 7 Drawing Sheets

ARTICLE TRANSPORT VEHICLE WITH LINKAGE MECHANISM

CROSS-REFERENCE TO RELATED APPLICATION

This application claims priority to Japanese Patent Application No. 2014-078746 filed Apr. 7, 2014, the disclosure of which is hereby incorporated in its entirety by reference.

FIELD OF THE INVENTION

The present invention relates to an article transport vehicle configured to travel along with a travel rail to transport an article while gripping an upper end portion of the transported article having a detachable lid.

DESCRIPTION OF THE RELATED ART

International Publication WO 2009/141976 (Patent Document 1) discloses a ceiling transport type article transport vehicle. In Patent Document 1, travel rails are installed to the ceiling. And article transfer locations are provided below the travel rails (i.e., on the ground). The article transport vehicle transports an article from an article transfer location of transport origin to an article transfer location of transport destination. The article transport vehicle has a vertically movable member and a pair of grip portions. The article transport vehicle operates as follows when receiving an article at the article transfer location of transport origin to transport the article to the article transfer location of transport destination. The article transport vehicle receives the article by lowering the vertically movable member at a travel position that corresponds to an article transfer location, and by gripping an upper end portion of the article with the grip portions provided to the vertically movable member, and by raising the vertically movable member. The article transport vehicle then travels to the travel position that corresponds to the article transfer location of transport destination while gripping the article. The article transport vehicle lowers the vertically movable member at that location and releases the grip on the article.

In Patent Document 1, each article to be transported is provided with a lid for closing the opening of the article. And the pair of grip portions of the article transport vehicle of Patent Document 1 grips the article such that the article is in an orientation in which a side face of the article (i.e. the surface that corresponds to the opening of the container closed by the lid) faces the direction that intersects perpendicularly with the travel direction of the article transport vehicle. In addition, the article transport vehicle is provided with cover portions which cover the forward area and the back area of the article with respect to the travel direction when transporting the article. Each of the front and the back cover portions is provided with a lid fall prevention member for preventing the lid from falling. Each lid fall prevention member can be switched or moved, between a fall prevention position in which the fall prevention member is located in front of the lid, and a retracted position in which the fall prevention member is retracted from the position in front of the lid. Each of the cover portions is also provided with an actuator for switching, or changing, the position of the lid fall prevention member between the fall prevention position and the retracted position.

The lid fall prevention members in Patent Document 1 are mounted to the cover portions. The cover portions are provided to the members on the ceiling side, and are not moved vertically as the vertically movable member is raised and lowered. Therefore, when the article is being raised or lowered by the vertically movable member, the lid fall prevention members cannot perform their function on the lid, and thus, cannot prevent the lid from falling from the article. Although it is conceivable to mount the lid fall prevention members to the vertically movable member, this may lead to an increase in the size and the weight of the vertically movable member because an actuator (for example, actuating motor) is required to change the position of the lid fall prevention member. In particular, the vertically movable member in a ceiling transport type article transport vehicle is often suspended by wires etc.; therefore, when the weight of the vertically movable member increases, the load on the wires etc. increases as well, which is not desirable. If the actuator is kept in the main body of the article transport vehicle and if the lid fall prevention members are installed in the vertically movable member, the vertically movable member would have to be allowed to be raised and lowered while maintaining the transmission of the actuating force from the actuator. This would cause the arrangement to become complex.

In addition, the same problem can arise in, for example, a ground traveling facility in which article transport vehicles travel along travel rails installed on the floor. For example, when the ground travel type article transport vehicle is provided with a SCARA (Selective Compliance Assembly Robot Arm) as a moving operation device, then the SCARA would move an article between the article transport vehicle and an article transfer location located at some distance from the article transport vehicle. In order to prevent the lid from falling while the article is moved between the article transfer location and the article transport vehicle in such a case, an actuating motor would have to be provided to the support portion located at the distal end of the SCARA. As in the case of the ceiling transport type article transport vehicle, a result of such arrangement may be an increase in the size and the weight of the support portion; thus, the load on the SCARA may increase. In addition, if the actuating motor is kept in the main body of the article transport vehicle, the support portion would have to be allowed to move while maintaining the transmission of the actuating force from the actuating motor to the lid fall prevention member provided to the support portion. This again would cause the arrangement to become complex.

SUMMARY OF THE INVENTION

In light of the issues discussed above, an article transport vehicle is desired in which the lid is prevented from falling during the transporting of the article having the lid from the transport origin to the transport destination, without causing an increase in the size or complexity of the device.

The article transport vehicle in accordance with the present invention is configured as follows, in one preferable embodiment. In an article transport vehicle for transporting an article which is a container having a removable lid for opening and closing an opening formed in a side face of the container, the article transport vehicle comprises: a travel member configured to travel along a travel rail; a pair of grip portions, connected to the travel member, for gripping an upper end portion of a transported article; grip actuator portion for actuating the pair of grip portions; a moving operation portion for moving the pair of grip portions and the grip actuator portion between a transfer purpose position and a travel purpose position; wherein the transfer purpose position is a position which is spaced apart from the travel member, and the travel purpose position is a position which is close to the travel member, wherein the travel member travels with the pair of grip portions located in the travel purpose position, wherein the grip actuator portion is configured, in the transfer purpose position, to move the pair of grip portions between gripping positions in which the pair of grip portions are located close to each other to grip an upper end portion of the container and grip release positions in which the pair of grip portions are located farther away from each other, wherein the article transport vehicle further comprises: a lid fall prevention member for preventing the lid from falling; and an operatively connecting mechanism for changing a position of the lid fall prevention member; wherein the lid fall prevention member is configured to be moved between a near position in which the lid fall prevention member is close to the lid on a side in which an outer surface of the lid is located, and an away position in which the lid fall prevention member is farther away from the lid to allow the lid to be attached and detached, wherein the operatively connecting mechanism: moves the lid fall prevention member from the near position to the away position as the pair of grip portions are moved from the gripping positions to the grip release positions by the grip actuator portion; and moves the lid fall prevention member from the away position to the near position as the pair of grip portions are moved from the grip release positions to the gripping positions by the grip actuator portion.

That is, by means of the operatively connecting mechanism, the lid fall prevention member is moved from the away position to the near position as the pair of grip portions are moved from the grip release positions to the gripping positions. As such, the lid fall prevention member can be moved between the near position and the away position without having to provide a separate actuator for actuating the lid fall prevention member. In addition, since the lid fall prevention member is moved as the grip portions are moved, the movement of the lid fall prevention member to the near position is completed when the grip portions reach their gripping positions. Therefore, the lid can be reliably prevented from falling from the container when the container is picked up from an article transfer location. As described above, with the article transport vehicle disclosed in, for example, Patent Document 1, although the lid can be prevented from falling after the grip portions gripping the upper end of the container has reached the travel purpose position, the lid cannot be prevented from falling while the grip portions are being moved from the transfer purpose position to the travel purpose position. The arrangement of the present invention makes it possible to prevent the lid from falling during the transporting of the article from the transport origin to the transport destination, without causing an increase in the size or complexity of the device.

DETAILED DESCRIPTION

Figure 1:
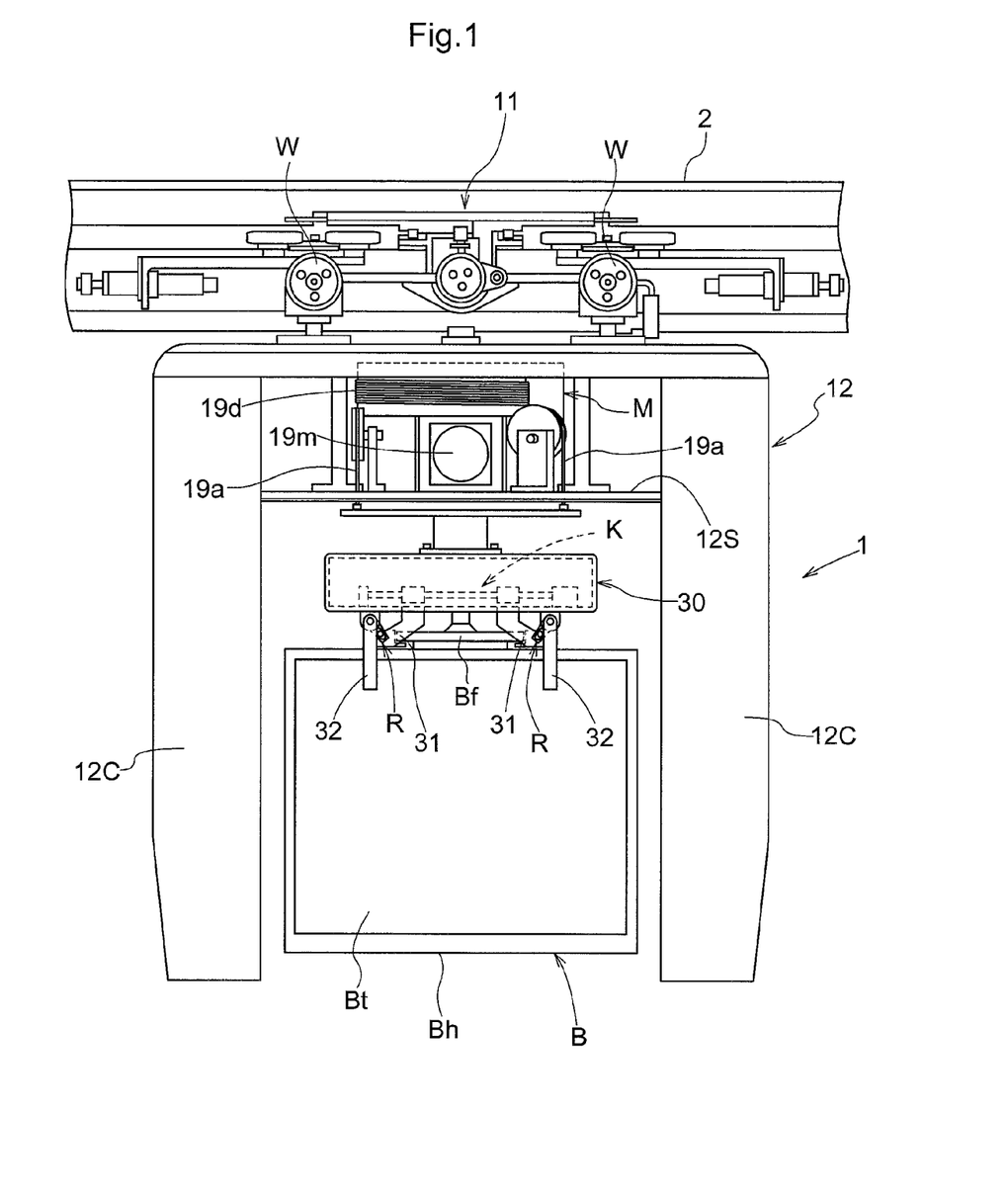
FIG. 1 is a side view of a ceiling transport vehicle in accordance with an embodiment of the present invention.

Embodiments of an article transport vehicle of the present invention are described next using an example in which a ceiling transport vehicle, i.e., an overhead transport vehicle, which travels along travel rails 2, is provided on the ceiling side. As shown in FIG. 1, the ceiling transport vehicle 1 includes a travel member 11 which is configured to travel on the travel rails 2 suspended from the ceiling, and a main body portion 12 connected to the travel member 11 by means of connecting shafts. The travel member 11 includes a plurality of travel wheels W which roll on the travel rails 2.

The article to be transported by the ceiling transport vehicle 1 is a semiconductor container (referred to hereinafter as a container B) such as a FOUP (Front Open Unified Pod) which has a detachable lid Bt which can open and close an opening formed in a side face. The ceiling transport vehicle 1 is configured to transport containers B, one at a time, among a plurality of transfer support platforms (article transfer locations), each of which is defined as a transfer location for each of the plurality of processing devices. Each transfer support platform is provided at a position spaced apart in the vertical direction from the travel rails 2. And each processing device is configured to perform predetermined operations (pattern exposure, etching, etc.) to work-in-process parts in the manufacture of semiconductor substrates, etc., and is located to a side of the travel path of the travel member 11 in plan view. Therefore, the ceiling transport vehicle 1 grips, or holds, and transports a container B with its side face in which the opening is formed (that is, the side face in which the lid Bt is present) facing the direction which perpendicularly intersects the travel direction of the travel member 11 in plan view. Note that "plan view" means a view as seen along the vertical direction.

The main body portion 12 includes a cover portion 12C which spans from a forward area to a backward area with respect to the travel direction of the travel member 11 and which, as shown in FIG. 1, is formed to have an inverted U-shape that opens downwardly in a side view. Note that a "side view" means a view as seen along a direction (lateral direction) that perpendicularly intersects the travel direction of the travel member in plan view. The main body portion 12 is divided by a horizontally oriented support plate 12S into its upper side and lower side. And a vertical movement actuator M (moving operation portion) is supported by, and on the upper side of, the support plate 12S. The vertical movement actuator M includes a vertical movement motor 19m and vertical movement drums 19d. One end of each wire 19a is connected to the corresponding vertical movement drum 19d. And each vertical movement drum 19d is driven and rotated by the vertical movement motor 19m to spool and feed out the wire 19a. The support plate 12S is provided with holes (not shown) through which the wires 19a extend. And the other end of each wire 19a, spooled or fed out by the vertical movement drum 19d, is connected to the vertically movable member 30 at a location below the support plate 12S. Thus the vertically movable member 30 is suspended by the wires 19a. The vertically movable member 30 is raised as the vertical movement motor 19m rotates in a forward direction, causing the vertical movement drum 19d to spool the wires 19a. And the vertically movable member 30 is lowered as the vertical movement motor 19m rotates in a reverse direction, causing the vertical movement drum 19d to feed out the wires 19a.

Figure 2:
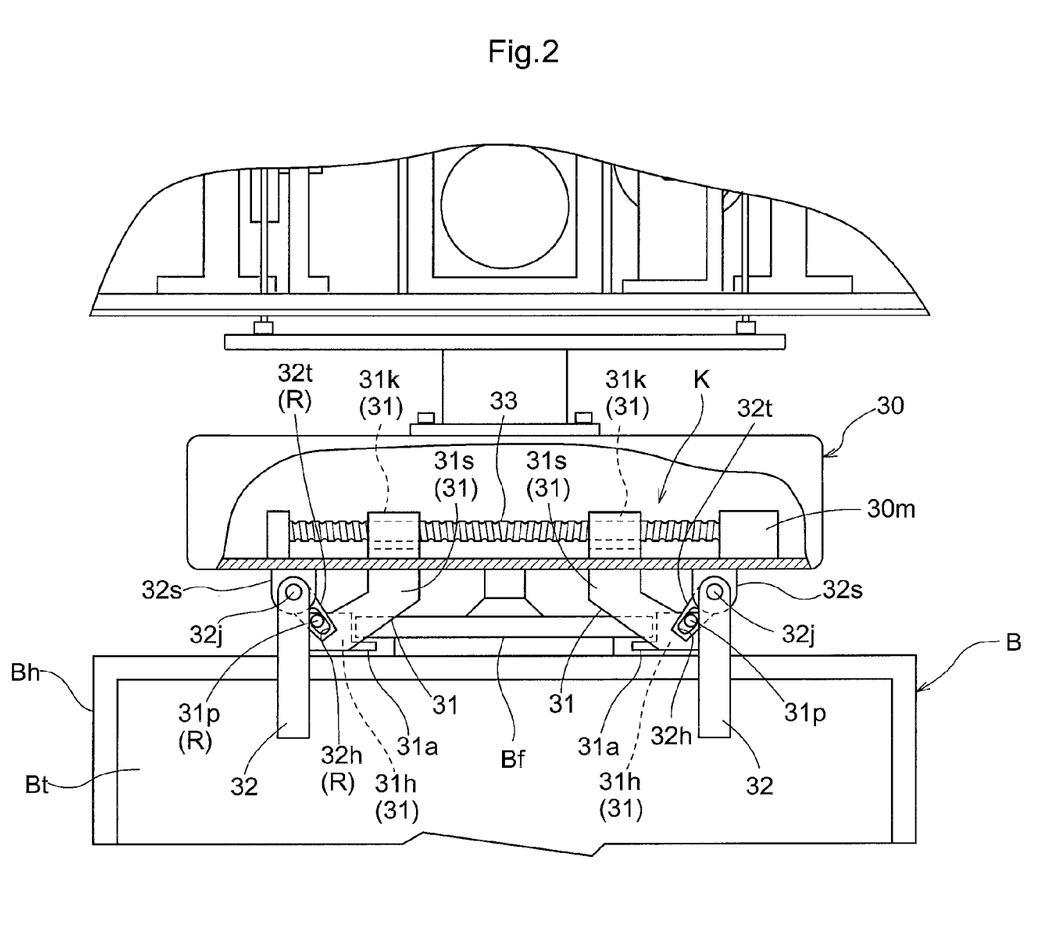
FIG. 2 is a side schematic view showing a principal portion of a vertically movable member and lid fall prevention members provided thereto.

As shown in FIG. 2, the vertically movable member 30 includes a pair of grip portions 31, and a grip portion actuating mechanism K. The pair of grip portions 31 grip or hold the flange portion Bf provided to the upper end of the container B. And the grip portion actuating mechanism causes the pair of grip portions 31 to move toward, or away from, each other. The grip portion actuating mechanism K includes a screw shaft 33 which is driven and rotated by an actuating motor 30m. The screw shaft 33 is configured such that the advancing direction of the thread is reversed at its central portion in the longitudinal direction.

As shown in FIGS. 2-6, each of the pair of grip portions 31 includes a gripping block 31h, a movable block 31k, and a connecting portion 31s. Each gripping block 31h includes a horizontal portion 31a for engaging the flange portion Bf of the container B. And the movable block 31k is located at the upper end portion of each of the pair of grip portions 31 and meshes with the screw shaft 33 at the meshing portion 31b. Each connecting portion 31s connects the gripping block 31h and the movable block 31k to each other. As stated above, the screw shaft 33 is configured such that the advancing direction of the thread is reversed at its central portion in the longitudinal direction. Each of the pair of movable blocks 31k meshes with the screw shaft 33 in the portion for which the advancing direction is different from the portion which the other of the pair of movable blocks 31k meshes with.

The pair of movable blocks 31k are moved closer toward each other when the screw shaft 33 is rotated by the actuating motor 30m in one rotational direction. Since the gripping blocks 31h are connected with respective movable blocks 31k through respective connecting portions 31s, the gripping blocks 31h are also moved closer toward each other as the pair of movable blocks 31k are moved closer toward each other. The pair of grip portions 31 engages the flange portion Bf attached to the upper end of the container main body Bh of the container B to grip, or hold, the container B by virtue of the fact that the pair of grip portions 31 are moved closer toward each other by the actuating force from the actuating motor 30m. In addition, the pair of movable blocks 31k are moved farther away from each other when the screw shaft 33 is rotated in the other and opposite rotational direction. The gripping blocks 31h are also moved farther away from each other as the pair of movable blocks 31k are moved away from each other. And the pair of grip portions 31 are released from their engagement with the flange portion Bf, thus releasing the container from its gripped state, by virtue of the fact that the pair of grip portions 31 are moved away from each other by the actuating force from the actuating motor 30m.

Here, with respect to the pair of grip portions 31, the positions in which the horizontal portions 31a of respective gripping blocks 31h have been moved closer toward each other and are separated, or spaced apart, by a closer-together distance defined in advance will be referred to as "gripping positions". In the "gripping positions", the horizontal portions 31a overlap with the flange portion Bf of the container B in plan view. Note that to "overlap in plan view" includes a situation in which at least a part of a member overlaps with at least a part of another member. And, with respect to the pair of grip portions 31, the positions in which the horizontal portions 31a of respective gripping blocks 31h have been moved farther away from each other and are separated, or spaced part, by a spaced-apart distance defined in advance will be referred to as "grip release positions". In the "grip release positions", the horizontal portions 31a do not overlap with the flange portion Bf of the container B in plan view. That is, the positions of the grip portions 31 can be switched, or changed, between the gripping positions and the grip release positions through sliding movement. In addition, since the pair of grip portions 31 are slidingly moved by the actuating motor 30m, the actuating motor 30m functions as a grip actuator portion. The pair of grip portions 31 and the flange portion Bf are configured to engage each other in a predetermined positional relationship in plan view such that the pair of grip portions 31 can grip the container B in a stable manner.

The ceiling transport vehicle 1 lowers the vertically movable member 30 to a position that corresponds to a transfer support platform, through operation of the vertical movement actuator M. (That is, the ceiling transport vehicle 1 causes the vertically movable member 30 to be located in a transfer purpose position.) Next, the ceiling transport vehicle 1 causes the pair of grip portions 31 to move toward each other by operating the actuating motor 30m to grip, or hold, the flange portion Bf of the container B placed on the transfer support platform. Subsequently, the ceiling transport vehicle 1 raises the vertically movable member 30 to a travel purpose position through operation of the vertical movement actuator M. In the present embodiment, the travel purpose position is such a position that the container B gripped by the grip portion 31 and the cover portion 12C overlap each other as seen along a horizontal direction or along the travel direction of the ceiling transport vehicle 1. And the ceiling transport vehicle 1 moves the container B to a travel position that corresponds to a different transfer support platform by causing the travel member 11 to travel, with the vertically movable member 30 located in the travel purpose position.

As described above, the vertically movable member 30 including the pair of grip portions 31 and the actuating motor 30m is suspended by the wires 19a, which are in turn connected to the vertical movement drums 19d. The vertical movement drums 19d together with the vertical movement motor 19m forms the vertical movement actuator M. And the vertical movement actuator M is supported by the support plate 12S of the main body portion 12. The main body portion 12 is connected to the travel member 11 by means of connecting shafts. And the ceiling transport vehicle 1 is formed by the travel member 11 and the main body portion 12. Here, the actuating motor 30m is the grip actuator portion for actuating the pair of grip portions 31 whereas the vertical movement actuator M is the moving operation portion for vertically moving, or raising and lowering, the vertically movable member 30.

Therefore, the ceiling transport vehicle 1 includes the pair of grip portions 31, connected to the travel member 11, for gripping the flange portion Bf in the upper end portion of the container B to be transported, the grip actuator portion (actuating motor 30m) for actuating the pair of grip portions 31, and the moving operation portion (vertical movement actuator M) for changing the positions of the pair of the grip portions 31 and the grip actuator portion (actuating motor 30m) between a transfer purpose position and a travel purpose position. Here, the "transfer purpose position" is defined to be a position that corresponds to the transfer support platform provided at a position spaced apart from the travel member 11 (and/or, from the travel rails 2) whereas the "travel purpose position" is defined to be a position close to the travel member 11 (and/or, to the travel rails 2). In addition, as described above, each processing devices is located to a side of the travel path of the travel member 11 in plan view in the present embodiment. Therefore, the grip portions 31 are configured to engage the flange portion Bf in the upper end portion of the container B to grip the container B with the lid Bt of the container B located on one side with respect to the direction that perpendicularly intersects the travel direction of the travel member 11 in plan view.

The vertically movable member 30 is also provided with lid fall prevention members 32 for preventing the lid Bt from falling from the container B. The lid fall prevention members 32 are configured such that their attitudes can be switched, or changed, between near positions in which the lid fall prevention members 32 are close to the lid Bt on the side the outer surface of the lid Bt is located, and away positions in which the lid fall prevention members 32 are farther away from, and out of the way of, the lid Bt. That is, the lid fall prevention members 32 are configured to prevent the lid from falling while in their near positions, and are configured to allow attachment and detachment of the lid while in their away positions. The attitudes of the lid fall prevention members 32 are switched, or changed, by the operatively connecting mechanism R provided in the vertically movable member 30.

While further details are given below, this operatively connecting mechanism R is rotated about a horizontal shaft $32j$ to switch, or change, the attitudes of the lid fall prevention members 32, as the pair of grip portions 31 (the pair of movable blocks $31k$) are moved by the actuating motor $30m$. More specifically, the operatively connecting mechanism R switch, or move, the lid fall prevention members 32 from the near positions to the away positions as the pair of grip portions 31 (the pair of movable blocks $31k$) are switched from the gripping positions to the grip release positions. Also, the operatively connecting mechanism R switch, or move, the lid fall prevention members 32 from the away positions to the near positions as the pair of grip portions 31 (the pair of movable blocks $31k$) are switched, or moved, from the grip release positions to the gripping positions. Note that the attitudes of the lid fall prevention members 32 are switched, or changed, by causing the lid fall prevention members 32 to move (or rotate) along the travel direction of the travel member 11. The structure and functions of the lid fall prevention members 32 are described next with reference to FIGS. 2-6.

Figure 3:
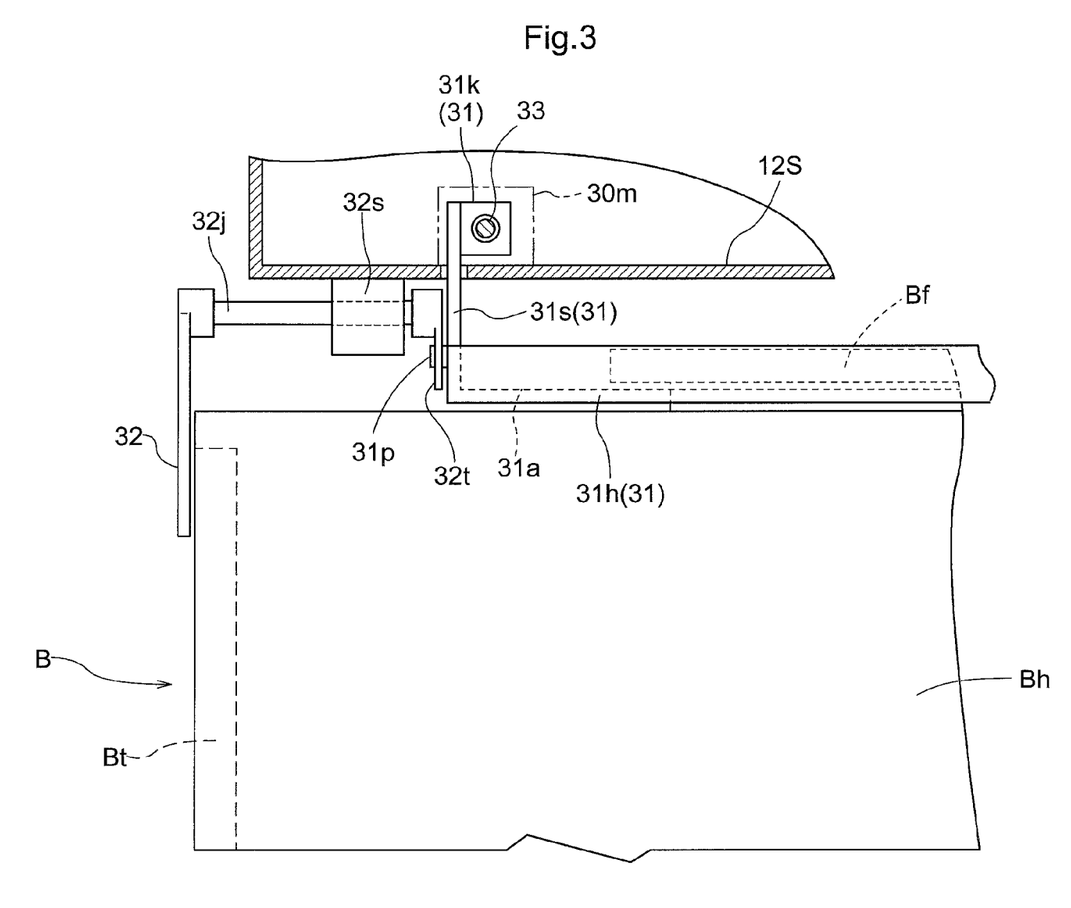
FIG. 3 is a front schematic view showing the principal portion of the vertically movable member and the lid fall prevention members provided thereto.

As shown in FIG. 3, each lid fall prevention member 32 is formed by, or consists of, or otherwise includes, a plate-shaped member which is thin in the direction (lateral direction) which perpendicularly intersects the travel direction of the travel member 11. In addition, the pair of lid fall prevention members 32 are configured such that the right and left lid fall prevention members are symmetrical to each other. Accordingly, in the following description, only one of the pair of lid fall prevention members 32 is described. However, the same description applies to the other of the pair of lid fall prevention members 32.

As shown in FIG. 3, each lid fall prevention member 32 is formed to be an elongated and thin plate-shaped member. An end of the lid fall prevention member 32 in its longitudinal direction is fixed to one end area of a horizontal shaft $32j$ which perpendicularly intersects the travel direction of the travel member 11 in plan view. The horizontal shaft $32j$ is rotatably supported by the shaft support member $32s$ which is provided to, and projects from, the undersurface of the support plate 12S. In addition, as shown in FIGS. 2 and 4, etc., a linking engaging portion in which an elongated slot $32h$ is formed is fixed to the horizontal shaft $32j$, in the area on the other side of the horizontal shaft $32j$ opposite from the end to which the lid fall prevention member 32 is fixed, such that the longitudinal direction of the lid fall prevention member 32 and the longitudinal direction of the elongated slot $32h$ form, or define, a predetermined angle.

Figure 4:
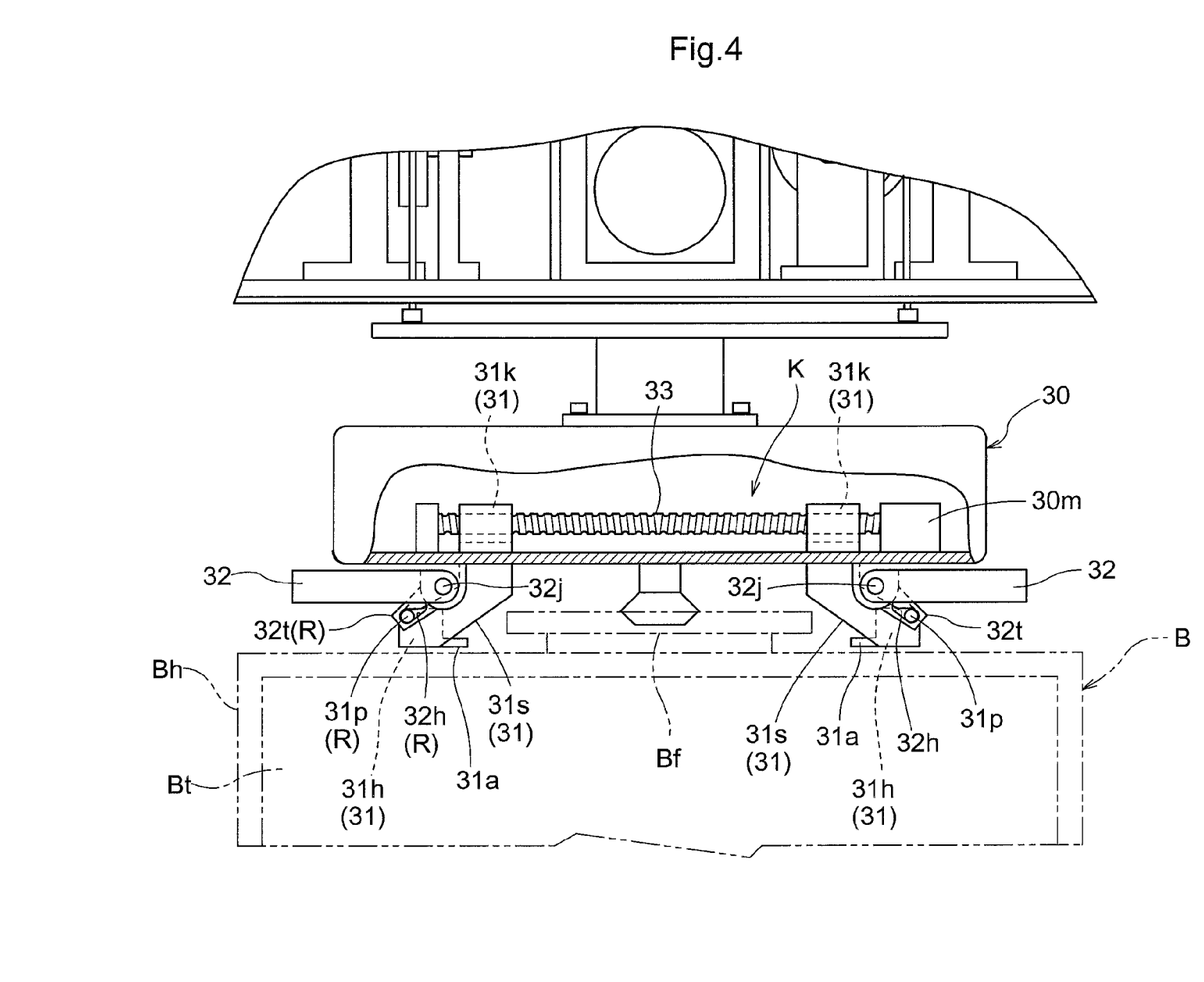
FIG. 4 is a side schematic view showing the principal portion of the vertically movable member and the lid fall prevention members provided thereto.

In addition, each of the pair of grip portions 31 includes an engaging pin $31p$ as shown in FIGS. 2 and 4 etc. Each engaging pin $31p$ is provided such that it projects in the direction which perpendicularly intersects the longitudinal direction of the screw shaft 33 (the direction along which the grip portions 31 move) in plan view. The engaging pin $31p$ engages the corresponding elongated slot $32h$ such that the engaging pin $31p$ can move freely along the longitudinal direction of the elongated slot $32h$.

Figure 5:
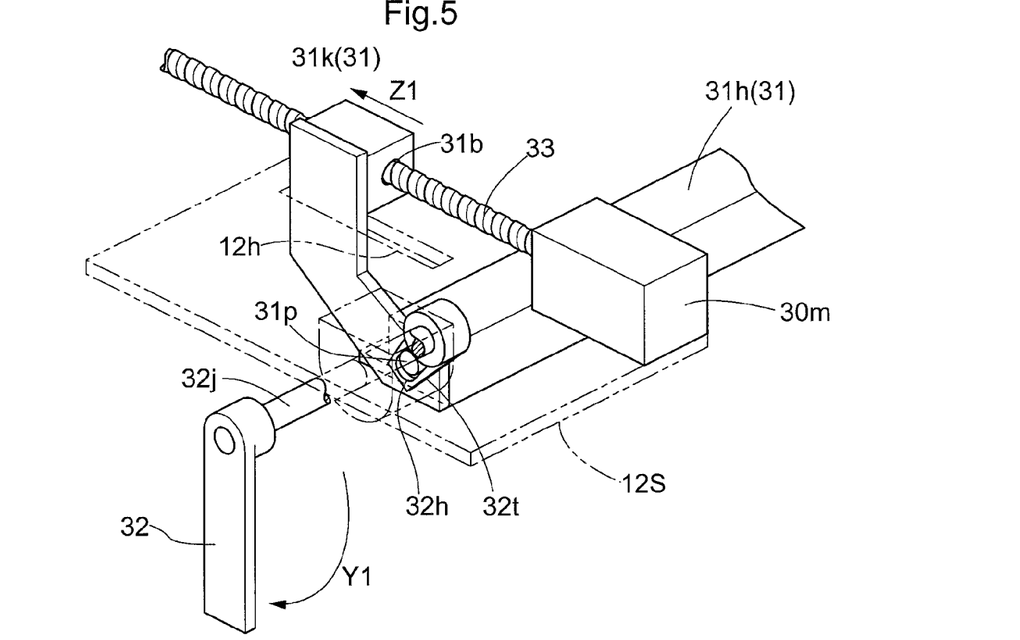
FIG. 5 is a perspective view showing a principal portion of a grip actuating mechanism and a lid fall prevention member operatively connecting mechanism.
Figure 6:
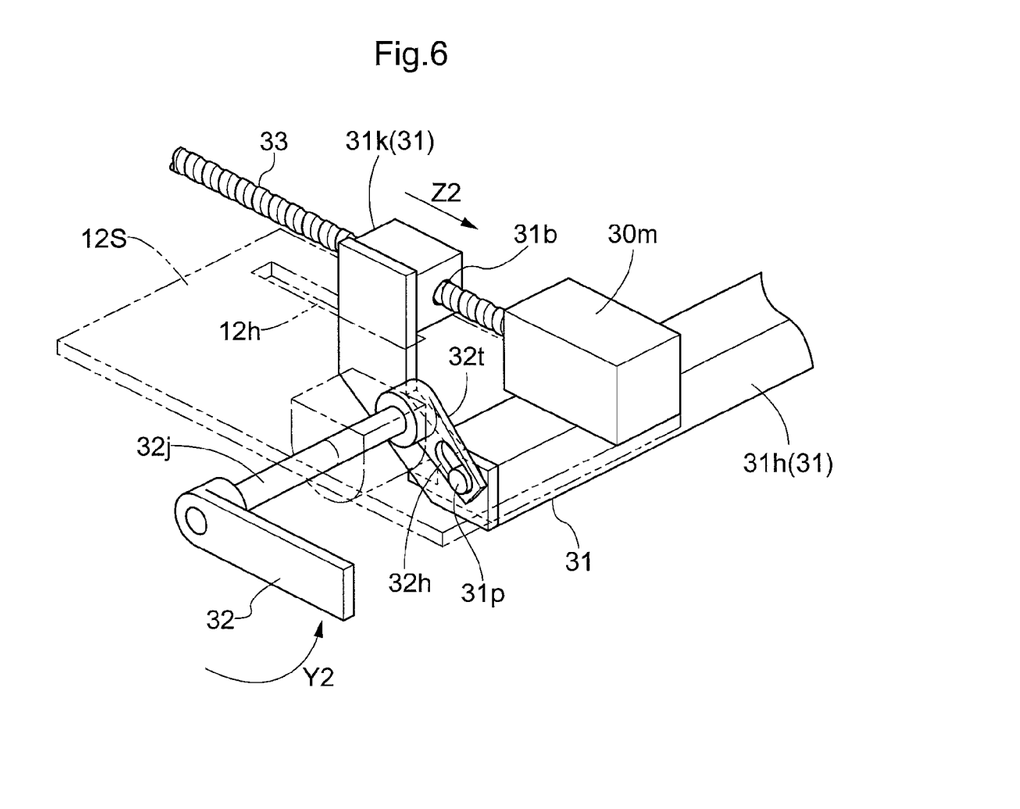
FIG. 6 is a perspective view showing a principal portion of the grip portion actuating mechanism and the lid fall prevention member operatively connecting mechanism.

As shown in FIG. 5, as the grip portion 31 is moved from the grip release position to the gripping position, the engaging pin $31p$ causes the linking engaging portion to rotate as the engaging pin $31p$ slides in, and along, the elongated slot $32h$. The lid fall prevention member 32 is moved from the away position to the near position as the linking engaging portion is rotated in this manner. Similarly, and as shown in FIG. 6, as the grip portion 31 is moved from the gripping position to the grip release position, the engaging pin $31p$ causes the linking engaging portion to rotate as the engaging pin $31p$ slides in, and along, the elongated slot $32h$. The lid fall prevention member 32 is moved from the near position to the away position as the linking engaging portion is rotated in this manner.

As such, in the present embodiment, the linkage mechanism, including the engaging pin $31p$ and the linking engaging portion in which the elongated slot $32h$, forms, or corresponds to, the operatively connecting mechanism R. That is, as shown by the arrow Y1 in FIG. 5, and the arrow Y2 in FIG. 6, the sliding movement of the grip portion 31 is converted into rotational movement of the plate-shaped member of the lid fall prevention member 32 by the operatively connecting mechanism R. FIGS. 2 and 3 show an example in which the lid fall prevention members 32 are in respective near positions in which the lid fall prevention members 32 are close to the lid Bt on the side the outer surface of the lid Bt is located to prevent the lid Bt from falling. And FIG. 4 shows an example in which the lid fall prevention members 32 are in their respective away positions in which the lid fall prevention members 32 are farther away from, and out of the way of, the lid Bt to allow the lid Bt to be attached and detached. Thus, the lid fall prevention members 32 are configured to be switched, or moved, between the near positions and the away positions. In addition, as shown in FIGS. 2 and 3 etc., each lid fall prevention member 32 is configured such that, in its near position, at least a part of the lid fall prevention member 32 is close to the upper end portion of the lid Bt when the opening of the container B is closed by the lid Bt.

As described above, the ceiling transport vehicle 1 is characterized in that it is provided with the lid fall prevention members 32 for preventing the lid Bt from falling and the operatively connecting mechanism R for switching, or changing, the positions or attitudes of the lid fall prevention members 32. And this operatively connecting mechanism R: switches, or moves, the lid fall prevention members 32 from the near positions to the away positions as the pair of grip portions 31 are switched, or moved, from the gripping positions to the grip release positions by the actuating motor $30m$; and switches, or moves, the lid fall prevention members 32 from the away positions to the near positions as the pair of grip portions 31 are switched, or moved, from the grip release positions to the gripping positions by the actuating motor 30m.

Alternative Embodiments (1) In the description provided above, an example is described in which the article transport vehicle of the present invention is a ceiling transport vehicle for transporting a container. However, the invention is not limited to this example. Instead, for example, the article transport vehicle may comprise a movable member having a travel member which travels on rails installed on the floor and a SCARA which includes a pair of grip portions and a grip actuator portion at its distal end and whose proximal end portion is connected to the travel member. In such a case, the SCARA and the actuating motor for the SCARA would change the positions of the pair of grip portions between the transfer purpose position and travel purpose position. Therefore, in such a case, the SCARA and the actuating motor for actuating the SCARA are, or correspond to, the moving operation portion.

(2) In the description provided above, an example is described in which the article to be transported is a container (FOUP) for transporting semiconductor substrates. However, the article to be transported is not limited to a FOUP and may be any container for any purpose, as long as it has an opening on its side and has a lid for opening and closing the opening.

Figure 7:
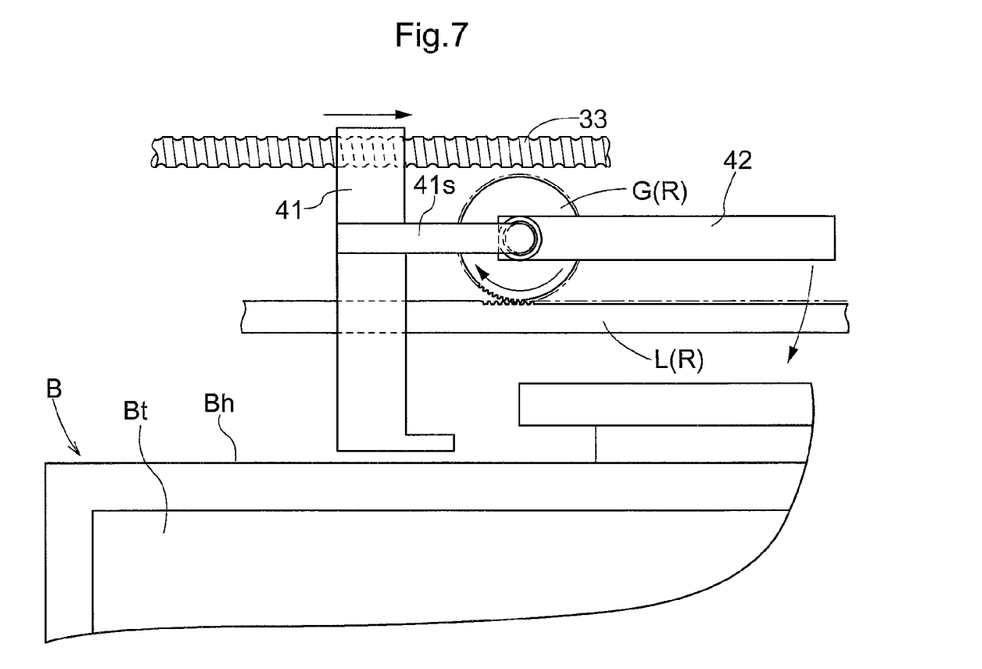
FIG. 7 is a side view showing an alternative embodiment of the grip portion actuating mechanism and the lid fall prevention member operatively connecting mechanism.
Figure 8:
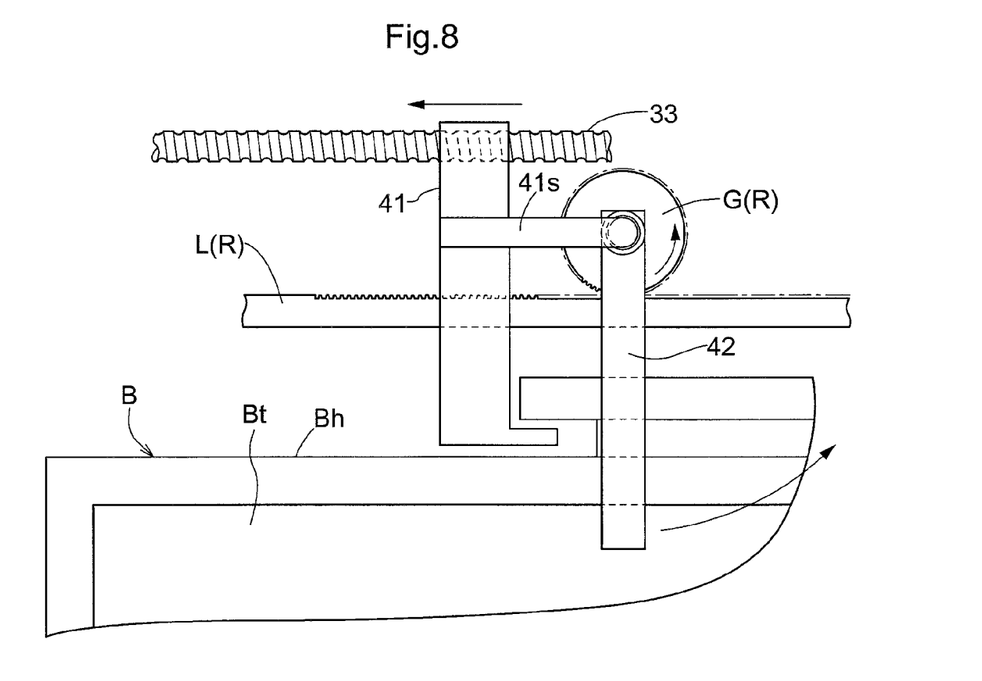
FIG. 8 is a side view showing the alternative embodiment of the grip portion actuating mechanism and the lid fall prevention member operatively connecting mechanism.

(3) In the description provided above, an example is described in which the operatively connecting mechanism R is formed by the linkage mechanism including the engaging pin 31p and the linking engaging portion in which the elongated slot 32h. However, the operatively connecting mechanism R is not limited to such an arrangement. For example, as shown in FIGS. 7 and 8, the operatively connecting mechanism R may be formed by a gear G and a rack L which meshes with this gear G. In this example, the gear G is held by a support 41S such as to maintain the relative position to the grip portion 31 along the longitudinal direction of the screw shaft 33. The lid fall prevention member 42 is connected to the gear G such that it rotates in unison with the gear G. The rack L is formed, or provided to, the top surface of the support plate 12S such that the rack L meshes with the gear G. With such an arrangement, as the grip portion 41 is moved along the longitudinal direction of the screw shaft 33, the lid fall prevention member 42 is switched, or moved, between the away position (see FIG. 7) and the proximate position (see FIG. 8) in synchronization with the rotating gear G.

Figure 9:
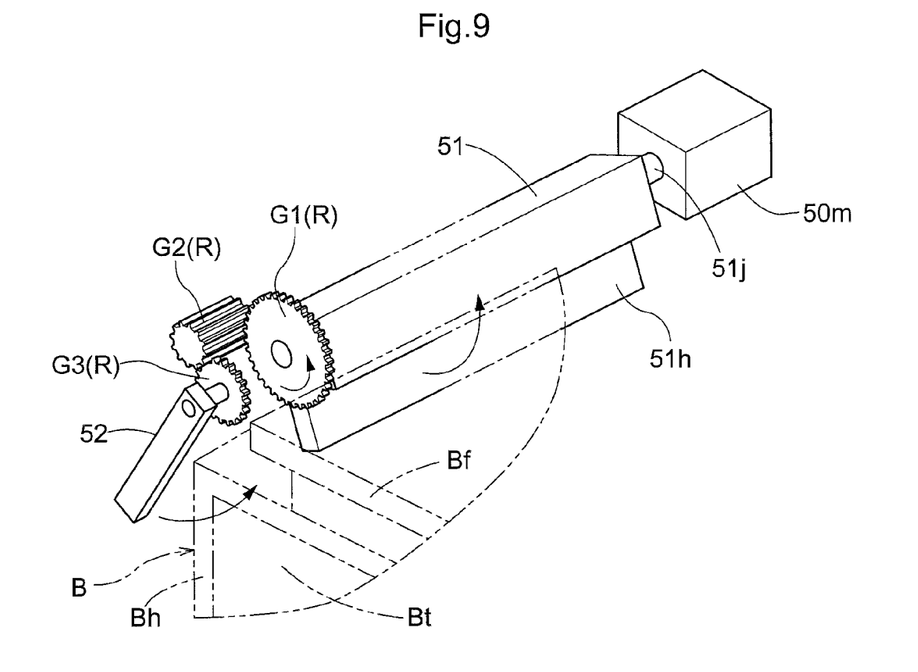
FIG. 9 is a side view showing another alternative embodiment of the grip portion actuating mechanism and the lid fall prevention member operatively connecting mechanism.
Figure 10:
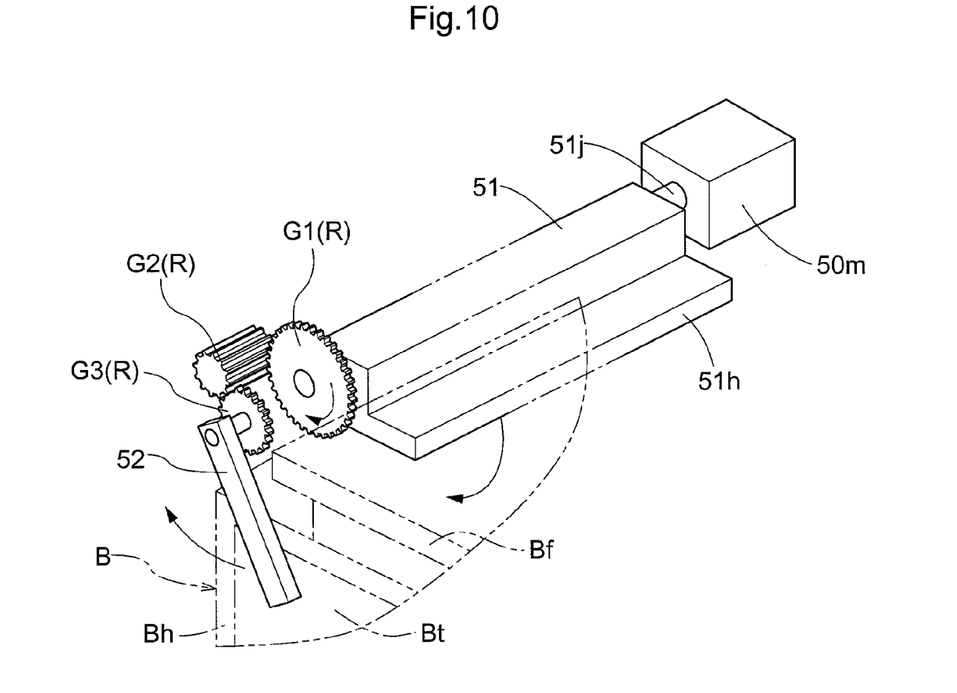
FIG. 10 is a side view showing the another alternative embodiment of the grip portion actuating mechanism and the lid fall prevention member operatively connecting mechanism.

In addition, as shown in FIGS. 9 and 10, the operatively connecting mechanism R may be formed by a first gear G1, the second gear G2, and a third gear G3. In this example, the grip portion 51 is configured to be rotatable about a shaft 51j. The shaft 51j is one that extends along the direction which perpendicularly intersects the travel direction of the travel member 11 in plan view. With this arrangement, each grip portion 51 is configured to be switched, or moved, by the actuating motor 50m between the grip release position (see FIG. 9) in which the horizontal portion 51h is directed downward and the gripping position (see FIG. 10) in which the horizontal portion 51h is directed horizontally. The operatively connecting mechanism R includes, or is formed by, the first gear G1 which rotates in unison with the shaft 51j, the third gear G3 which rotates in unison with the lid fall prevention member 52, and the second gear G2 which meshes both the first gear G1 and the third gear G3. The lid fall prevention member 52 is switched, or moved, to the away position (see FIG. 9) as the horizontal portion 51h is moved to the grip release position by the actuating motor 50m. And the lid fall prevention member 52 is switched, or moved, to the proximate position (see FIG. 10) as the horizontal portion 51h is moved to the gripping position by the actuating motor 50m.

(4) In the description provided above, an example is described in which the transfer support platforms of semiconductor processing devices function as article transfer locations of transport origin and article transfer locations of transport destination. However, the invention is not limited to such arrangement. Instead, for example, a carry in and out location of a storage facility, or a temporary storage, etc. may function as an article transfer location of transport origin or an article transfer location of transport destination.

The article transport vehicle of the embodiment of the present invention described above is described briefly in general terms.

The article transport vehicle in one preferable embodiment is configured as follows. In an article transport vehicle for transporting an article which is a container having a removable lid for opening and closing an opening formed in a side face of the container, the article transport vehicle comprises: a travel member configured to travel along a travel rail; a pair of grip portions, connected to the travel member, for gripping an upper end portion of a transported article; grip actuator portion for actuating the pair of grip portions; a moving operation portion for moving the pair of grip portions and the grip actuator portion between a transfer purpose position and a travel purpose position; wherein the transfer purpose position is a position which is spaced apart from the travel member, and the travel purpose position is a position which is close to the travel member, wherein the travel member travels with the pair of grip portions located in the travel purpose position, wherein the grip actuator portion is configured, in the transfer purpose position, to move the pair of grip portions between gripping positions in which the pair of grip portions are located close to each other to grip an upper end portion of the container and grip release positions in which the pair of grip portions are located farther away from each other, wherein the article transport vehicle further comprises: a lid fall prevention member for preventing the lid from falling; and an operatively connecting mechanism for changing a position of the lid fall prevention member; wherein the lid fall prevention member is configured to be moved between a near position in which the lid fall prevention member is close to the lid on a side in which an outer surface of the lid is located, and an away position in which the lid fall prevention member is farther away from the lid to allow the lid to be attached and detached, wherein the operatively connecting mechanism: moves the lid fall prevention member from the near position to the away position as the pair of grip portions are moved from the gripping positions to the grip release positions by the grip actuator portion; and moves the lid fall prevention member from the away position to the near position as the pair of grip portions are moved from the grip release positions to the gripping positions by the grip actuator portion.

That is, by means of the operatively connecting mechanism, the lid fall prevention member is moved from the away position to the near position as the pair of grip portions are moved from the grip release positions to the gripping positions. As such, the lid fall prevention member can be moved between the near position and the away position without having to provide a separate actuator for actuating the lid fall prevention member. In addition, since the lid fall prevention member is moved as the grip portions are moved, the movement of the lid fall prevention member to the near position is completed when the grip portions reach their gripping positions. Therefore, the lid can be reliably prevented from falling from the container when the container is picked up from an article transfer location. As described above, with the article transport vehicle disclosed in, for example, Patent Document 1, although the lid can be prevented from falling after the grip portions gripping the upper end of the container has reached the travel purpose position, the lid cannot be prevented from falling while the grip portions are being moved from the transfer purpose position to the travel purpose position. The arrangement of the present invention makes it possible to prevent the lid from falling during the transporting of the article from the transport origin to the transport destination, without causing an increase in the size or complexity of the device.

In one embodiment, the article transport vehicle preferably further comprises a vertically movable member which can be raised and lowered with respect to the travel member, wherein the vertically movable member is preferably provided with the pair of grip portions, the grip actuator portion, the operatively connecting mechanism, and the lid fall prevention member.

For ceiling transport vehicles in which a vertically movable member that can be raised and lowered is provided to the travel member, there are requests to reduce the weight of the vertically movable member to the extent possible. When the lid fall prevention member is arranged to be moved between the near position and the away position as the gripping operation of the pair of grip portions is performed, there is no need to provide a separate actuator, in addition to the grip actuator portion, for moving the lid fall prevention member between the near position and the away position; thus, increase in weight of the vertically movable member can be prevented.

In one embodiment of the article transport vehicle, the lid fall prevention member is preferably configured such that, in the near position, at least a part of the lid fall prevention member is close to an upper end portion of the lid when the opening of the container is closed by the lid.

The lid fall prevention member is provided to the vertically movable member which is located above the container. Therefore, when the lid fall prevention member is so located to be above the lid when the lid is closing the opening of the container, the distance, between the position at which the lid fall prevention member is mounted to the vertically movable member and the position at which the lid fall prevention member acts on the lid to prevent the lid from falling, can be made relatively short. In other words, the arrangement described above can keep the lid fall prevention member from becoming large in size. And when the lid is about to come off from the opening of the container, any movement, outwardly away from the container, of the upper end portion of the lid of the container is restricted by virtue of the fact that a part of the lid fall prevention member located in the near position comes into contact with the upper end portion of the lid, thus reducing the possibility of the lid falling from the container.

In one embodiment, the pair of grip portions are preferably configured to grip an upper end portion of the container with the lid of the container located on one side with respect to a direction that perpendicularly intersects a travel direction of the travel member in plan view, wherein the lid fall prevention member preferably: includes a plate-shaped member which is thin in the direction that perpendicularly intersects the travel direction of the travel member; and is configured to be moved along the travel direction of the travel member between the near position and the away position. Note that the "plan view" means a view as seen along the vertical direction.

The lid fall prevention member is provided to prevent the lid, which is facing one direction (a lateral direction) that perpendicularly intersects the travel direction of the travel member in plan view, from falling. And so, the dimension, in the lateral direction, of the lid fall prevention member can be small when the lid fall prevention member includes a plate-shaped member which is thin in the direction that perpendicularly intersects the travel direction of the travel member, and is configured to be moved along the travel direction of the travel member between the near position and the away position. Therefore, the space taken up by the lid fall prevention member does not have to be large when the vertically movable member is vertically moved between the transfer purpose position and the travel purpose position. Thus, when installing other facilities such as processing devices etc., near the article transport vehicle, there would be fewer restrictions on the installation that results from any interference with the lid fall prevention member, which increases the degree of freedom for the installation of such other facilities.

In one embodiment of the article transport vehicle, the pair of grip portions are preferably configured such that positions the pair of grip portions are changed between the gripping positions and the grip release positions through sliding movements, wherein the lid fall prevention member is preferably configured such that an attitude of the lid fall prevention member is changed between the near position and the away position as the lid fall prevention member is rotated about a horizontal axis, and wherein the operatively connecting mechanism preferably includes a linkage mechanism which converts sliding movement of at least one of the pair of grip portions into rotational movement of the lid fall prevention member.

Thus, by using a linkage mechanism which converts sliding movement of at least one of the pair of grip portions into rotational movement of the lid fall prevention member, the lid fall prevention member is rotated about the horizontal axis and its attitude is changed between the near position and the away position, with the sliding movement of the grip portions. With the arrangement described above, the position of the lid fall prevention member can be changed between the near position and the away position by means of a simple mechanism.

What is claimed is:

1. An article transport vehicle for transporting an article which is a container having a removable lid for opening and closing an opening formed in a side face of the container, the article transport vehicle comprising:
    a travel member configured to travel along a travel rail;
    a pair of grip portions, connected to the travel member, for gripping an upper end portion of a transported article;
    a grip actuator portion for actuating the pair of grip portions;
    a moving operation portion for moving the pair of grip portions and the grip actuator portion between a transfer purpose position and a travel purpose position;
    wherein the transfer purpose position is a position which is spaced apart from the travel member, and the travel purpose position is a position which is close to the travel member, wherein the travel member travels with the pair of grip portions located in the travel purpose position,
    wherein the grip actuator portion is configured, in the transfer purpose position, to move the pair of grip portions between gripping positions in which the pair of grip portions are located close to each other to grip an upper end portion of the container and grip release positions in which the pair of grip portions are located farther away from each other,
    wherein the article transport vehicle further comprises:
    a lid fall prevention member for preventing the lid from falling; and an operatively connecting mechanism for changing a position of the lid fall prevention member;

wherein the lid fall prevention member is configured to be moved between a near position in which the lid fall prevention member is close to the lid on a side in which an outer surface of the lid is located, and an away position in which the lid fall prevention member is farther away from the lid to allow the lid to be attached and detached, wherein the operatively connecting mechanism: moves the lid fall prevention member from the near position to the away position as the pair of grip portions are moved from the gripping positions to the grip release positions by the grip actuator portion; and moves the lid fall prevention member from the away position to the near position as the pair of grip portions are moved from the grip release positions to the gripping positions by the grip actuator portion, wherein the operatively connecting mechanism includes a linkage mechanism which converts sliding movement of at least one of the pair of grip portions into rotational movement of the lid fall prevention member.

2. The article transport vehicle as defined in claim 1, further comprising:

a vertically movable member which can be raised and lowered with respect to the travel member, wherein the vertically movable member is provided with the pair of grip portions, the grip actuator portion, the operatively connecting mechanism, and the lid fall prevention member.

3. The article transport vehicle as defined in claim 2, wherein the lid fall prevention member is configured such that, in the near position, at least a part of the lid fall prevention member is close to an upper end portion of the lid when the opening of the container is closed by the lid.

4. The article transport vehicle as defined in claim 3, wherein the pair of grip portions are configured to grip an upper end portion of the container with the lid of the container located on one side with respect to a direction that perpendicularly intersects a travel direction of the travel member in plan view, and wherein the lid fall prevention member: includes a plate-shaped member which is thin in the direction that perpendicularly intersects the travel direction of the travel member; and is configured to be moved along the travel direction of the travel member between the near position and the away position.

5. The article transport vehicle as defined in claim 4, wherein the pair of grip portions are configured such that positions the pair of grip portions are changed between the gripping positions and the grip release positions through sliding movements, and wherein the lid fall prevention member is configured such that an attitude of the lid fall prevention member is changed between the near position and the away position as the lid fall prevention member is rotated about a horizontal axis.

6. The article transport vehicle as defined in claim 3, wherein the pair of grip portions are configured such that positions the pair of grip portions are changed between the gripping positions and the grip release positions through sliding movements, and wherein the lid fall prevention member is configured such that an attitude of the lid fall prevention member is changed between the near position and the away position as the lid fall prevention member is rotated about a horizontal axis.

7. The article transport vehicle as defined in claim 2, wherein the pair of grip portions are configured to grip an upper end portion of the container with the lid of the container located on one side with respect to a direction that perpendicularly intersects a travel direction of the travel member in plan view, and wherein the lid fall prevention member: includes a plate-shaped member which is thin in the direction that perpendicularly intersects the travel direction of the travel member; and is configured to be moved along the travel direction of the travel member between the near position and the away position.

8. The article transport vehicle as defined in claim 7, wherein the pair of grip portions are configured such that positions the pair of grip portions are changed between the gripping positions and the grip release positions through sliding movements, and wherein the lid fall prevention member is configured such that an attitude of the lid fall prevention member is changed between the near position and the away position as the lid fall prevention member is rotated about a horizontal axis.

9. The article transport vehicle as defined in claim 2, wherein the pair of grip portions are configured such that positions the pair of grip portions are changed between the gripping positions and the grip release positions through sliding movements, and wherein the lid fall prevention member is configured such that an attitude of the lid fall prevention member is changed between the near position and the away position as the lid fall prevention member is rotated about a horizontal axis.

10. The article transport vehicle as defined in claim 1, wherein the pair of grip portions are configured to grip an upper end portion of the container with the lid of the container located on one side with respect to a direction that perpendicularly intersects a travel direction of the travel member in plan view, and wherein the lid fall prevention member: includes a plate-shaped member which is thin in the direction that perpendicularly intersects the travel direction of the travel member; and is configured to be moved along the travel direction of the travel member between the near position and the away position.

11. The article transport vehicle as defined in claim 10, wherein the pair of grip portions are configured such that positions the pair of grip portions are changed between the gripping positions and the grip release positions through sliding movements, and wherein the lid fall prevention member is configured such that an attitude of the lid fall prevention member is changed between the near position and the away position as the lid fall prevention member is rotated about a horizontal axis.

12. The article transport vehicle as defined in claim 1, wherein
 the pair of grip portions are configured such that positions the pair of grip portions are changed between the gripping positions and the grip release positions through sliding movements, and
 wherein the lid fall prevention member is configured such that an attitude of the lid fall prevention member is changed between the near position and the away position as the lid fall prevention member is rotated about a horizontal axis.

* * * * *